(12) United States Patent
Mukae et al.

(10) Patent No.: US 7,667,373 B2
(45) Date of Patent: Feb. 23, 2010

(54) DRIVE UNIT

(75) Inventors: Hideaki Mukae, Hyogo (JP); Yusuke Adachi, Osaka (JP)

(73) Assignee: Panasonic Corporation, Kadoma (JP)

( * ) Notice: Subject to any disclaimer, the term of this patent is extended or adjusted under 35 U.S.C. 154(b) by 0 days.

(21) Appl. No.: 12/469,153

(22) Filed: May 20, 2009

(65) Prior Publication Data

US 2009/0230818 A1    Sep. 17, 2009

Related U.S. Application Data

(63) Continuation of application No. PCT/JP2008/000278, filed on Feb. 20, 2008.

(30) Foreign Application Priority Data

Feb. 21, 2007    (JP)    .............................. 2007-040890

(51) Int. Cl.
    *H01I 41/09*    (2006.01)
(52) U.S. Cl. ................................. 310/323.17
(58) Field of Classification Search ................................
    310/323.01–323.21, 328, 330; *H01I 41/08*
    See application file for complete search history.

(56) References Cited

U.S. PATENT DOCUMENTS

| | | |
|---|---|---|
| 4,560,263 A | 12/1985 | Katsuma et al. |
| 5,453,653 A | 9/1995 | Zumeris |
| 5,616,980 A | 4/1997 | Zumeris |
| 5,682,076 A | 10/1997 | Zumeris |
| 5,714,833 A | 2/1998 | Zumeris |
| 5,760,528 A | 6/1998 | Tomikawa |
| 5,777,423 A | 7/1998 | Zumeris |
| 5,877,579 A | 3/1999 | Zumeris |
| 6,064,140 A | 5/2000 | Zumeris |
| 6,218,769 B1 | 4/2001 | Iino et al. |
| 6,252,333 B1 | 6/2001 | Iino et al. |

(Continued)

FOREIGN PATENT DOCUMENTS

JP    59-101608    6/1984

(Continued)

OTHER PUBLICATIONS

International Search Report and Written Opinion for corresponding Application No. PCT/JP2008/000278 mailed May 20, 2008.

(Continued)

*Primary Examiner*—Walter Benson
*Assistant Examiner*—Karen B Addison
(74) *Attorney, Agent, or Firm*—Renner, Otto, Boisselle & Sklar, LLP

(57) ABSTRACT

A drive unit (1) includes a stage (3), a first ultrasonic actuator (4A) for driving the stage (3) in the X direction, and a second ultrasonic actuator (4B) for driving the stage (3) in the Y direction. In driving the stage (3) in only one of the X and Y directions, one of the first and second ultrasonic actuators (4A, 4B) corresponding to the one of the directions generates a composite vibration of a longitudinal vibration parallel to a contact surface of the stage (3) and a bending vibration orthogonal to the contact surface, while the other ultrasonic actuator generates only a longitudinal vibration parallel to the contact surface of the stage (3).

7 Claims, 10 Drawing Sheets

U.S. PATENT DOCUMENTS

| | | |
|---|---|---|
| 6,897,598 B2 * | 5/2005 | Kato et al. ............. 310/323.02 |
| 7,545,085 B2 * | 6/2009 | Adachi ....................... 310/365 |
| 2006/0202589 A1 | 9/2006 | Kasai et al. |
| 2006/0290234 A1 | 12/2006 | Kasai et al. |

FOREIGN PATENT DOCUMENTS

| | | |
|---|---|---|
| JP | 02-041673 | 2/1990 |
| JP | 07-184382 | 7/1995 |
| JP | 08-237970 | 9/1996 |
| JP | 08-280185 | 10/1996 |
| JP | 11-235063 | 8/1999 |
| JP | 2007-006596 | 1/2007 |

OTHER PUBLICATIONS

Form PCT/ISA/237.

* cited by examiner

DRIVE UNIT

CROSS-REFERENCE TO RELATED APPLICATION

This application is a continuation of PCT International Patent Application No. PCT/JP2008/000278, filed on Feb. 20, 2008, which claims priority on Japanese Patent Application No. 2007-040890, filed on Feb. 21, 2007, the entire contents of which are expressly incorporated by reference herein.

BACKGROUND

The present invention relates to a drive unit including a first actuator and a second actuator for driving a drive target.

Drive units for driving a drive target by first and second actuators have conventionally been known. An example of the drive units is disclosed by Patent Document 1.

The drive unit disclosed by Patent Document 1 includes a stage as a drive target, two first actuators for driving the drive target in the predetermined X direction and two second actuators for driving the drive target in the predetermined Y direction orthogonal to the X direction.

Each of the first and second actuators is constituted of a piezoelectric element which is substantially rectangular when viewed in plan, and generates a longitudinal vibration and a bending vibration. The first and second actuators are arranged to be in contact with the stage. In this state, the piezoelectric elements are allowed to generate the longitudinal and bending vibrations to cause a friction force between the actuators and the stage, thereby moving the stage. More specifically, the travel amount of the stage by the first actuator and that by the second actuator are adjusted so that the stage can be moved in a desired direction between the X and Y directions.

However, in moving the stage in only one of the X and Y directions, for example, in only the X direction, the second actuator is kept in a halt state and only the first actuator is driven. In this case, even though the second actuator is in a halt state, the second actuator is biased against the stage with a certain biasing force, and thus a friction force between the second actuator and the stage hinders the movement of the stage in the X direction by the first actuator.

According to the drive unit disclosed by Patent Document 1, in moving the stage in only one of the X and Y directions, e.g., in only the X direction, the first actuator is driven to generate a composite vibration of the longitudinal vibration and the bending vibration, and the second actuator is driven to generate only the longitudinal vibration. Since the direction of the longitudinal vibration is orthogonal to the stage, the second actuator is periodically separated from the stage while the first actuator is driven. In this way, the friction force between the second actuator and the stage is reduced so that the second actuator does not hinder the movement of the stage in the X direction by the first actuator.

Patent Document 1: Published Japanese Patent Application No. H11-235063

SUMMARY

According to the drive unit disclosed by Patent Document 1, in moving the stage by only one of the actuators, the other actuator is driven to generate only the longitudinal vibration so that the other actuator is periodically separated from the stage. However, on the other hand, the biasing force of the other actuator to the stage is periodically increased, and a large friction force is periodically generated between the actuator and the stage. Therefore, as a whole, the friction force between the other actuator and the stage is not reduced very much.

An object of the present invention is, in driving the drive target by one of the actuators, to allow reducing the friction force between the other actuator and the drive target so as to smoothly drive the drive target.

To achieve the object, a drive unit includes: a drive target; a first actuator which is arranged in contact with the drive target, and drives the drive target in a first drive direction parallel to a contact surface of the drive target by generating a vibration in a direction parallel to the contact surface of the drive target and a vibration in a direction intersecting with the contact surface of the drive target; and a second actuator which is arranged in contact with the drive target, and drives the drive target in a second drive direction which is different from the first drive direction and parallel to the contact surface of the drive target by generating a vibration in a direction parallel to the contact surface of the drive target and a vibration in a direction intersecting with the contact surface of the drive target, wherein in driving the drive target in only one of the first and second drive directions, one of the first and second actuators corresponding to the one of the drive directions generates a composite vibration of a vibration in a direction parallel to the contact surface of the drive target and a vibration in a direction intersecting with the contact surface of the drive target, while the other actuator of the first and second actuators generates only a vibration in a direction parallel to the contact surface of the drive target.

According to the drive unit, in driving the drive target in one of the first and second drive directions, the drive target can smoothly be driven by the one of the actuators corresponding to the one of the drive directions because a friction force between the other actuator which does not correspond to the one of the drive directions and the drive target can be reduced.

EXPLANATION OF REFERENCE NUMERALS

3 Stage (drive target)
4A, 204A, 304A First ultrasonic actuator (first actuator)

4B, 204B, 304B Second ultrasonic actuator (second actuator)
5 Actuator body
59 Driver element

DETAILED DESCRIPTION OF THE PREFERRED EMBODIMENTS

Hereinafter, embodiments of the present invention will be described in detail with reference to the accompanying drawings.

Embodiment 1

Figure 1:
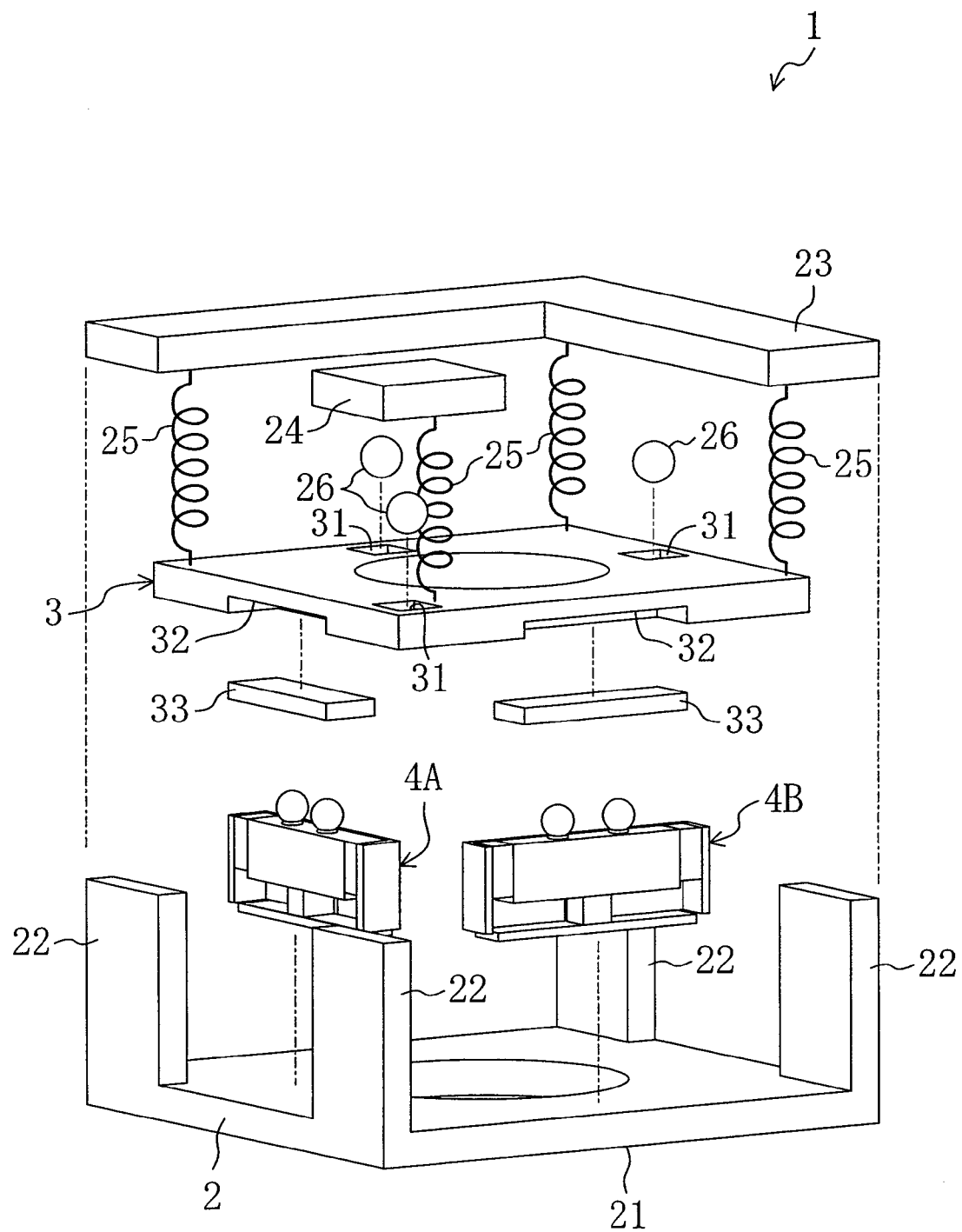
FIG. 1 is an exploded perspective view illustrating a structure of a drive unit according to Embodiment 1.
Figure 2:
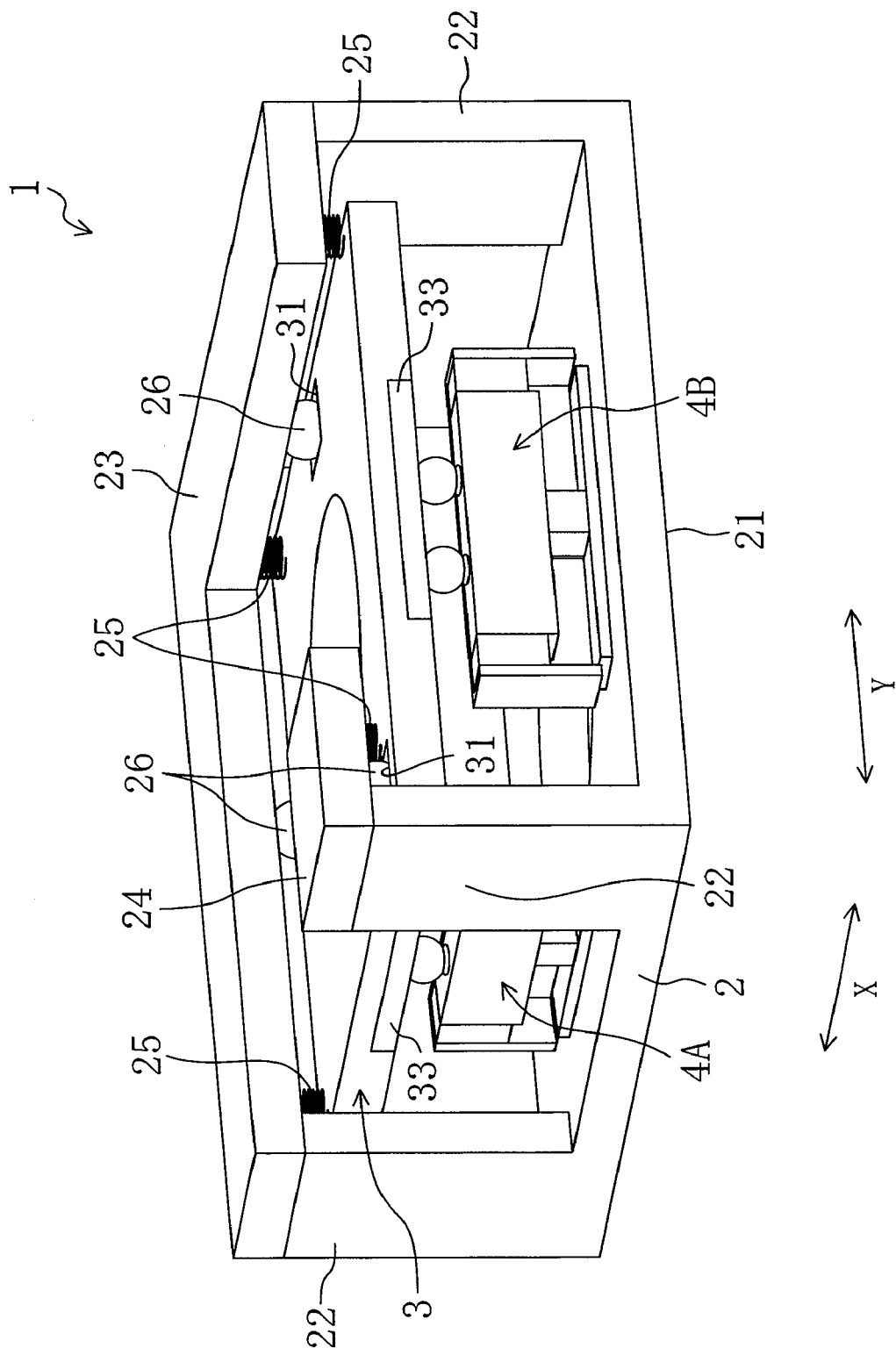
FIG. 2 is a perspective view of a drive unit.

As shown in FIGS. 1 and 2, a drive unit 1 according to Embodiment 1 of the present invention includes a fixed member 2, a stage 3 movably supported relative to the fixed member 2, first and second ultrasonic actuators 4A and 4B for driving the stage 3 and a control unit (not shown) for performing drive control to the first and second ultrasonic actuators 4A and 4B.

The fixed member 2 includes a bottom wall portion 21 having a square shape when viewed from the top, four side wall sections 22 projecting upward from four corners of the bottom wall portion 21, respectively, and a first ceiling wall section 23 which is to be attached to edge portions of three of the side wall sections 22 so as to be opposed to the bottom wall portion 21, and a second ceiling wall section 24 which is to be attached to an end portion of the other one of the side wall sections 22 so as to be opposed to the bottom wall portion 21. The side wall sections 22 are formed so that each of side edge potions of the bottom wall portion 21 which are opposed to each other as a pair has two of the side wall sections 22 provided thereon. The two side wall sections 22 provided on each of the pair of side edge portions of the bottom wall portion 21 are located on both ends of each of the side edge portions, respectively. The first ceiling wall section 23 is a flat plate member having an approximately L shape when viewed from the top and extending over the end portions of the three side wall sections 22. The second ceiling wall section 24 is a flat plate member having an approximately square shape when viewed from the top.

The stage 3 is a metal flat plate member having a square shape when viewed from the top. The stage 3 is placed in the fixed member 2 so as to be spaced from the side wall sections 22. The stage 3 may be formed of resin such as polycarbonate or the like. The stage 3 constitutes a drive target.

In one side edge portion at a lower surface of the stage 3 and one of two other side edge portions at the lower surface each of which is perpendicular to the side edge portion, openings are respectively provided so that each of the openings extends from the lower surface to a side surface of the stage 3, thereby providing concave portions 32. Ceramic reinforcing members 33 are inserted in and bonded to the concave portions 32, respectively. The reinforcing members 33 are arranged so as to be flush with the lower surface of the stage 3. The reinforcing members 33 are not limited to ceramic-made members but may be members made of any material having abrasion resistance.

The stage 3 is supported at its four corners by support springs 25 with respect to the first ceiling wall section 23 and the second ceiling wall section 24. In this state, metal round rolling elements 26 (three rolling elements in this embodiment) are provided between the stage 3, and each of the first ceiling wall section 23 and the second ceiling wall section 24. On an upper surface of the stage 3 (which is a surface opposed to the first ceiling wall section 23 and the second ceiling wall section 24), receiving holes 31 are formed to restrict relative displacement of the rolling elements 26 with respect to the stage 3. The rolling elements 26 are placed in the receiving holes 31, respectively, and are in contact with respective lower surfaces of the first ceiling wall section 23 and the second ceiling wall section 24. More specifically, two of the rolling elements 26 are interposed between the stage 3 and the first ceiling wall section 23 and the other one of the rolling elements 26 is interposed between the stage 3 and the second ceiling wall section 24. Thus, the stage 3 is formed so as to be bias-supported with certain space from the first ceiling wall section 23 and the second ceiling wall section 24 and also to be movable in parallel to the upper and lower surfaces of the stage 3 with the rolling elements 26 interposed between the stage 3 and each of the first ceiling wall section 23 and the second ceiling wall section 24.

Figure 3:
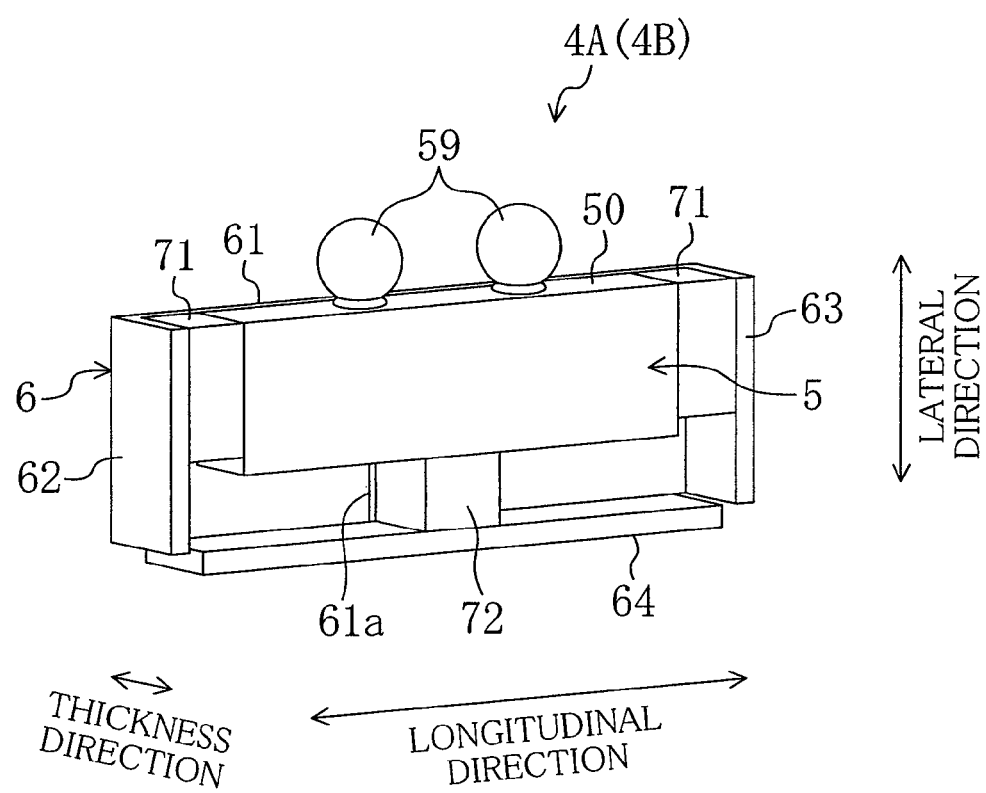
FIG. 3 is a perspective view of an ultrasonic actuator.

The first and second ultrasonic actuators 4A and 4B have the same structure. As shown in FIG. 3, each ultrasonic actuator 4A (4B) includes an actuator body 5 for generating vibration, driver elements 59 for transmitting driving force of the actuator body 5 to the stage 3, a case 6 for housing the actuator body 5, support rubbers 71, provided between the actuator body 5 and the case 6, for elastically supporting the actuator body 5 and a bias rubber 72 for biasing the actuator body 5 to the stage 3.

The actuator body 5 is formed of a piezoelectric element 50.

The piezoelectric element 50 has an approximately rectangular parallelepiped shape including a pair of principal surfaces each having an approximately rectangular shape and being opposed to each other, a pair of long side surfaces each being perpendicular to each of the principal surfaces, extending along long sides of the principal surfaces and being opposed to each other, and a pair of short side surfaces each being perpendicular to each of the principal surfaces and the long side surfaces and extending along short sides of the principal surfaces.

Figure 4:
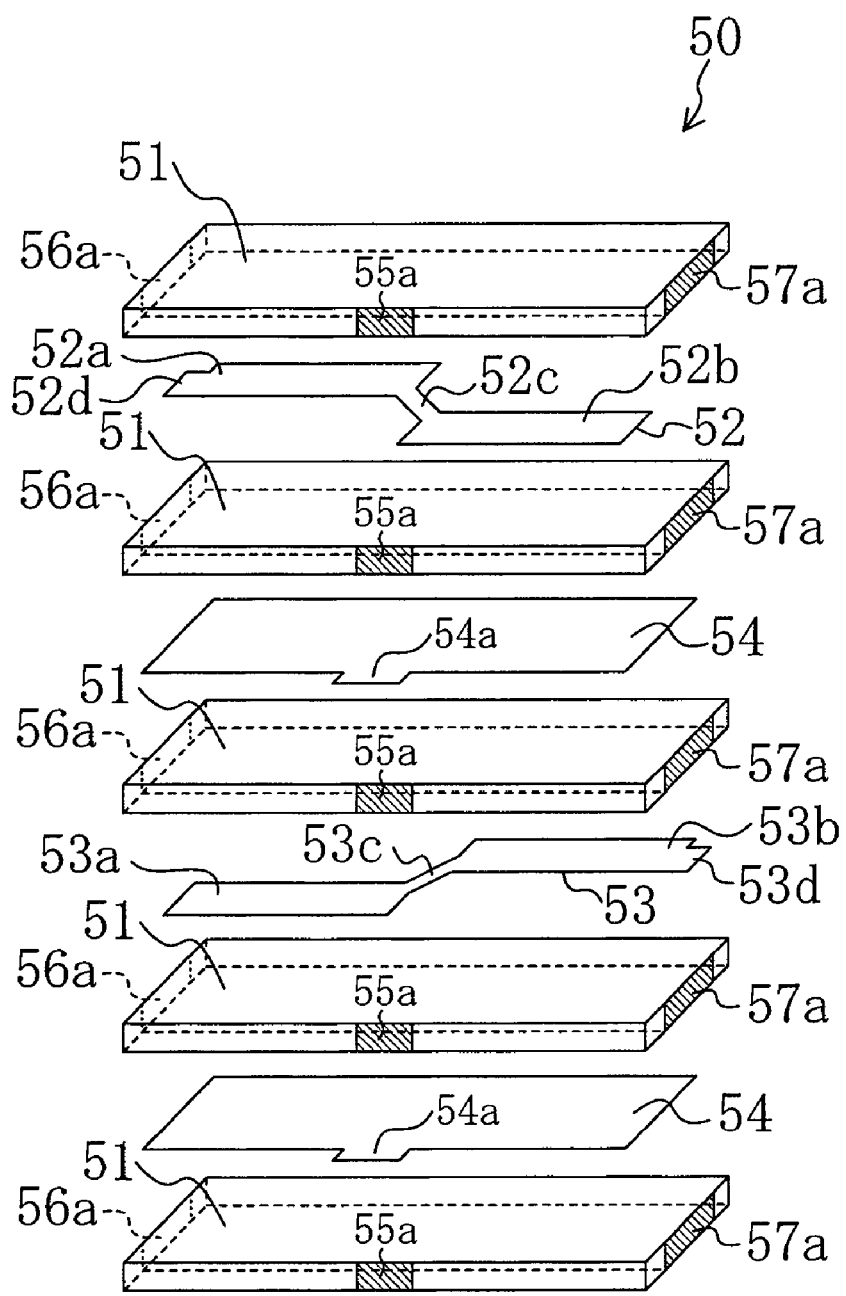
FIG. 4 is an exploded perspective view of a piezoelectric element.

As shown in FIG. 4, the piezoelectric element 50 includes five piezoelectric element layers 51 and four internal electrode layers 52, 54, 53 and 54, which are alternately stacked. Specifically, the internal electrode layers 52, 54, 53 and 54 are, respectively, formed of a first power supply electrode layer 52, a common electrode layer 54, a second power supply electrode layer 53 and another common electrode layer 54 which are alternately provided in a stacking direction with each of the piezoelectric element layers 51 interposed between any two of the internal electrode layers. Each of the first power supply electrode layer 52, the second power supply electrode layer 53 and the common electrode layers 54 is printed on an associated one of the piezoelectric element layers 51.

Each of the piezoelectric element layers 51 is an insulation layer, for example, formed of a ceramic material such as lead zirconate titanate and has an approximately rectangular parallelepiped shape including a pair of principal surfaces, a pair of long side surfaces and a pair of short side surfaces in the same manner as the piezoelectric element 50. Moreover, an external electrode 55a is formed in center part of a long side surface in the longitudinal direction, in which the driver elements 59 are not provided, an external electrode 56a is formed in center part of one short side surface in the lateral direction, and an external electrode 57a is formed in center part of the other short side surface in the lateral direction.

Each of the common electrode layers 54 has an approximately rectangular shape provided approximately on an entire principal surface of an associated one of the piezoelectric element layers 51. Moreover, a lead electrode 54a is formed in one long side portion of each of the common electrode layers 54 so as to extend from center part of the common electrode layer 54 in the longitudinal direction thereof to the external electrode 55a of the piezoelectric element layer 51.

Figure 5:
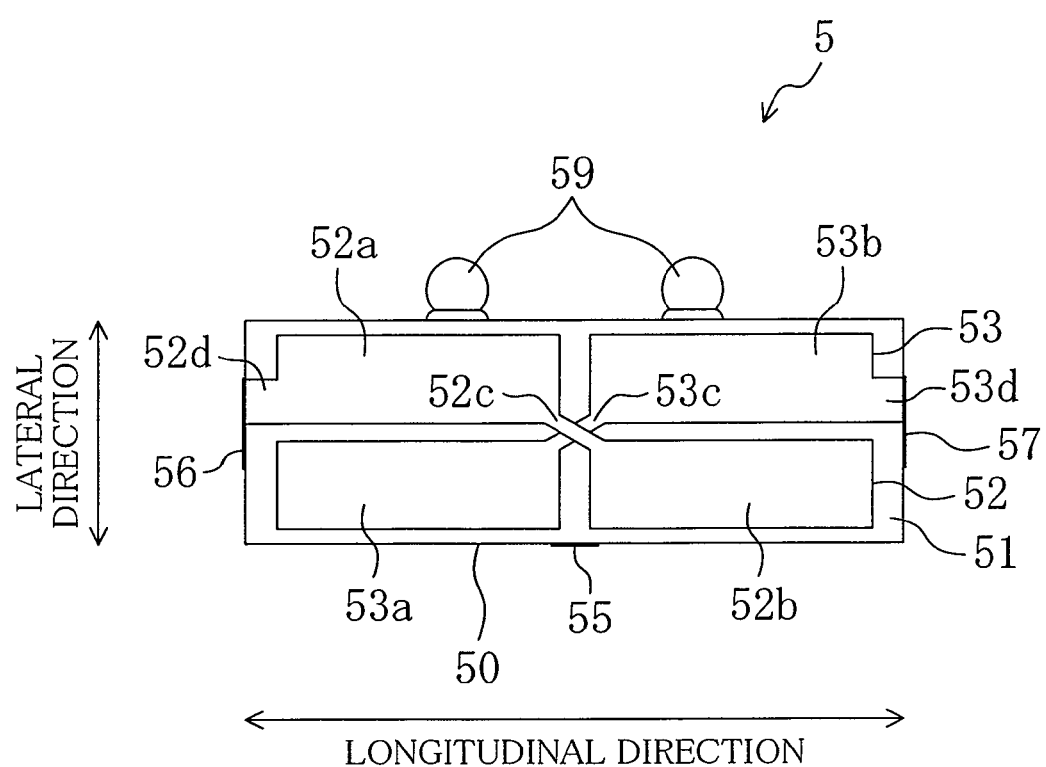
FIG. 5 is a schematic front view illustrating a structure of an actuator body.

Suppose that the principle surface of each of the piezoelectric element layers 51 is divided in four areas, i.e., two areas in the longitudinal direction and two areas in the lateral direction. As shown in FIG. 5, the first power supply electrode layer 52 includes first electrodes 52a and 52b respectively formed in one pair of the areas located in one diagonal direction of the principal surface, and a conductive electrode 52c for connecting the first electrodes 52a and the 52b to bring them in conduction. Each first electrode 52a (52b) is an electrode having an approximately rectangular shape and overlaps with the common electrode layers 54 when viewed in the stacking direction. That is, each first electrode 52a (52b) is opposed to an associated one of the common electrode layers 54 with an associated one of the piezoelectric element layers 51 interposed therebetween. One of the first electrodes 52a and 52b, i.e., the first electrode 52a is provided with a lead electrode 52d extending to the external electrode 56a of the piezoelectric element layer 51.

The second power supply electrode layer 53 includes a pair of second electrodes 53a and 53b respectively formed in the other pair of the areas located in the other diagonal direction of the principal surface, and a conductive electrode 53c for connecting the second electrodes 53a and the 53b to bring them in conduction. When viewed in the stacking direction, the second electrode 53a is provided in one area of the other pair, which is located adjacent to the first electrode 52a in the lateral direction and adjacent to the first electrode 52b in the longitudinal direction, and the second electrode 53b is provided in the other area of the same pair, which is located adjacent to the first electrode 52a in the longitudinal direction and adjacent to the first electrode 52b in the lateral direction. Each second electrode 53a (53b) is an electrode having an approximately rectangular shape and overlaps with the common electrode layers 54, when viewed in the stacking direction. That is, each second electrode 53a (53b) is opposed to an associated one of the common electrode layers 54 with an associated one of the piezoelectric element layers 51 interposed therebetween. Moreover, one of the first electrodes 53a and 53b, i.e., the second electrode 53b is provided with a lead electrode 53d extending to the external electrode 57a of the piezoelectric element layer 51.

In the piezoelectric element 50 formed by alternately stacking the piezoelectric element layers 51 and the internal electrode layers 52, 54, 53 and 54, the respective external electrodes 55a of the piezoelectric element layers 51 align in the stacking direction in center part of one long side surface thereof in the longitudinal direction, thereby forming an integrated external electrode 55. The lead electrodes 54a provided to the common electrode layers 54 are electrically connected to the integrated external electrode 55. In the same manner, the respective external electrodes 56a of the piezoelectric element layers 51 align in the stacking direction in center part of one short side surface of the piezoelectric element 50 in the lateral direction, thereby forming an integrated external electrode 56. The lead electrode 52d of the first power supply electrode layer 52 is electrically connected to the integrated external electrode 56. Furthermore, the respective external electrode 57a of the piezoelectric element layers 51 align in the stacking direction in center part of the other short side surface of the piezoelectric element 50 in the lateral direction, thereby forming an integrated external electrode 57. The lead electrode 53d of the second power supply electrode layer 53 is electrically connected to the integrated external electrode 57.

On the other long side surface of the piezoelectric element 50 in which the external electrodes 55a are not provided, the driver elements 59 are provided to align in the longitudinal direction so as to be spaced apart from each other. The driver elements 59 are provided in parts of the long side surface located at a distance of 30% to 35% of the full length of the long side surface inwardly from both edges in the longitudinal direction, respectively. Each of the locations of the driver elements 59 corresponds to a loop of a second mode of bending vibration where vibration is maximum. Each of the driver elements 59 has an approximately spherical phase and is formed of a hard material such as ceramic and the like.

Figure 6:
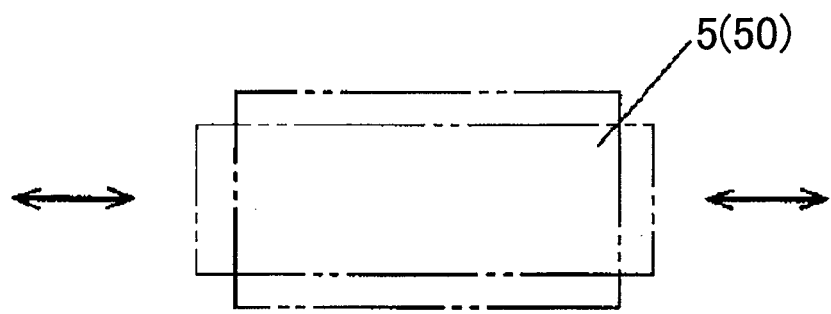
FIG. 6 is a conceptual diagram illustrating displacement made by a first mode of longitudinal vibration of the piezoelectric element.
Figure 7:
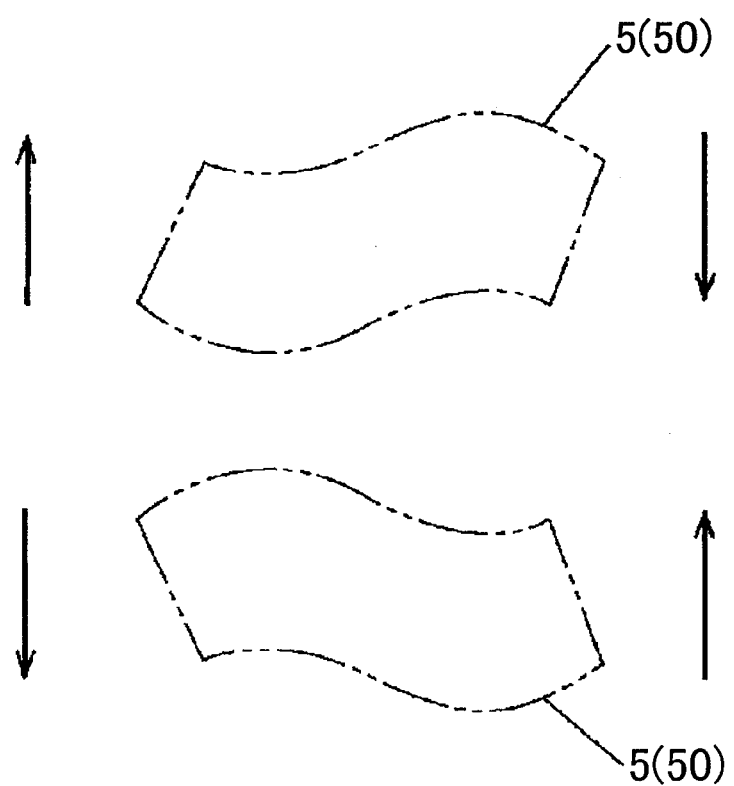
FIG. 7 is a conceptual diagram illustrating displacement made by a second mode of bending vibration of a piezoelectric element.
Figure 8A:
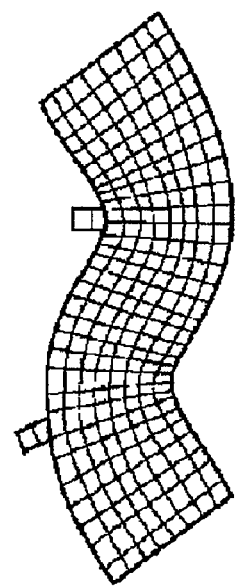
FIG. 8 is a conceptual diagram illustrating the operation of a piezoelectric element.
Figure 8B:
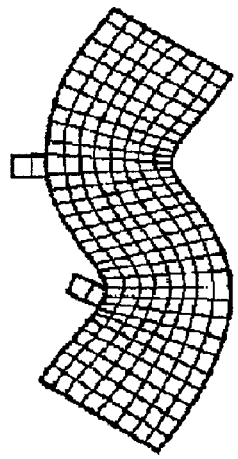
Figure 8C:
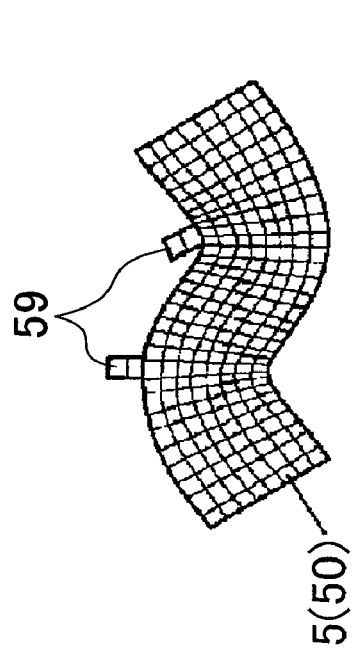
Figure 8D:
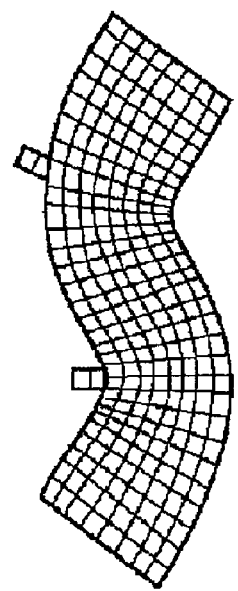

The external electrode 55 is connected to the ground. An alternating voltage at a predetermined frequency is applied to the external electrode 56. An alternating voltage of a phase shifted from the phase of the alternating voltage by 90° is applied to the external electrode 57. Thus, alternating voltages which have different phases from each other by 90° are applied to the one pair of the first electrodes 52a and 52b and the other pair of the second electrode 53a and 53b, respectively, each of which is located in an associated one of the diagonal directions of the principal surface of each piezoelectric element layer 51, so that a first mode of longitudinal vibration (i.e., so-called expand/contract vibration) shown in FIG. 6 and a second mode of bending vibration shown in FIG. 7 are induced.

Respective resonance frequencies of longitudinal vibration and bending vibration are determined by a material, a shape and the like of the piezoelectric element 50. Furthermore, the resonance frequencies both are influenced by force supporting the piezoelectric element 50 and a position where the piezoelectric element 50 is supported. Taking this into consideration, the resonance frequencies are substantially matched to each other. Alternating voltages having a frequency around the resonance frequencies and phases shifted by 90° from each other are applied to the external electrodes 56 and 57, respectively. Thus, the first mode of longitudinal vibration and the second mode of bending vibration are harmonically induced in the piezoelectric element 50, so that the piezoelectric element 50 changes itself into shapes shown in FIGS. 8(a), 8(b), 8(c) and 8(d) in this order.

As a result, each of the driver elements 59 provided to the piezoelectric element 50 makes an approximately elliptical motion in a plane parallel to a principal surface of the piezoelectric element 50 (i.e., a plane parallel to the drawing sheet of FIG. 8).

The case 6 is formed of resin and has an approximately rectangular parallelepiped box shape corresponding to the piezoelectric element 50. The case 6 includes a principal wall portion 61 which is parallel to the principal surface of the piezoelectric element 50 and has an approximately rectangular shape, a first short side wall portion 62 provided at a short side portion located at one side in the longitudinal direction (i.e., the left side of FIG. 3) of the principal wall portion 61, a second short side wall portion 63 provided at a short side portion located at the other side in the longitudinal direction (i.e., the right side of FIG. 3) of the principal wall portion 61, and a long side wall portion 64 provided at a long side portion located at one side in the lateral direction (i.e., the lower side of FIG. 3) of the principal wall portion 61. That is, no wall portion is provided at a plane opposed to the principal wall portion 61 and a long side portion (corresponding to the long side surface of the piezoelectric element 50 on which the driver elements 59 are provided) of the case 6 located at the other side in the lateral direction (i.e., the upper side of FIG. 3) of the principal wall portion 61, so that the case 6 is open at the above-described one side in the thickness direction (in the normal direction of the principal wall portion 61) and at the above-described other side of the lateral direction.

The actuator body 5 is placed in the case 6 having the above-described structure. Specifically, the actuator body 5 is placed in the case 6 so that one of the principal surfaces of the piezoelectric element 50 is in contact with the principal wall portion 61 and one of the long side surfaces of the piezoelectric element 50 (at which the external electrode 55 is provided) is opposed to the long side wall portion 64. In this state, the driver elements 59 stick out from the case 6 at the above-described other side in the lateral direction. The support rubbers 71 are provided between the one of the short side surfaces of the piezoelectric element 50 and the first short side wall portion 62 of the case 6 and between the other one of the short side surfaces of the piezoelectric element 50 and the second short side wall portion 63 of the case 6, respectively. Because the support rubbers 71 are elastic, the piezoelectric element 50 can be supported without damping longitudinal vibration of the piezoelectric element 50 although each of the side surfaces of the piezoelectric element 50 corresponds to a loop of longitudinal vibration. The support rubbers 71 are in contact with not only the actuator body 5 and the first and second short side wall portions 62 and 63 but also an inner surface of the principal wall portion 61. Moreover, the bias rubber 72 is provided between one of the long side surfaces of the piezoelectric element 50 and the long side wall portion 64 of the case 6. The bias rubber 72 is in contact with not only the actuator body 5 and the long side wall portion 64 but also the inner surface of the principal wall portion 61.

Electrodes 61a are provided in parts of the inner surface of the principal wall portion 61 in which the support rubbers 71 and the bias rubber 72 are in contact (only the electrodes 61a in contact with the bias rubber 72 is shown). The electrodes 61a are in conduction with terminal electrodes (not shown) provided on an outer surface of the principal wall portion 61, respectively.

Each of the support rubbers 71 is formed of conductive rubber obtained by mixing metal particles into silicone rubber and has an approximately rectangular parallelepiped shape. The support rubbers 71 elastically support the actuator body 5 with the actuator body 5 biased in the longitudinal direction thereof. Also, the support rubbers 71 bring the external electrodes 56 and 57 of the piezoelectric element 50 into conduction with electrodes which are provided at the short side portions of the inner surface of the principal wall portion 61 and are conductive with the terminal electrodes, respectively.

The bias rubber 72 is also formed of conductive rubber obtained by mixing metal particles into silicone rubber and has an approximately rectangular parallelepiped shape in the same manner as the support rubbers 71. The bias rubber 72 biases the actuator body 5 in the lateral direction thereof (i.e., the lateral direction corresponds to a bias direction). The bias rubber 72 also brings the external electrode 55 of the piezoelectric element 50 into conduction with the electrode 61a of the principal wall portion 61.

That is, power can be supplied to the piezoelectric element 50 by supplying power to the terminal electrodes provided on the outer surface of the case 6.

The first and second ultrasonic actuators 4A and 4B having the above-described structure are provided between the stage 3 and the bottom wall portion 21 of the fixed member 2. The first and second ultrasonic actuators 4A and 4B are arranged so that the long side wall portion 64 of the case 6 is fixed to the bottom wall portion 21 of the fixed member 2 and the driver elements 59 are in contact with a lower surface of the stage 3. That is, the first and second ultrasonic actuators 4A and 4B are arranged so that the lateral direction of the piezoelectric element 50 is perpendicular to the lower surface of the stage 3 and the longitudinal direction of the piezoelectric element 50 is in parallel to the lower surface of the stage 3. In other words, the first and second ultrasonic actuators 4A and 4B are arranged so that the direction of bending vibration of the piezoelectric element 50 is perpendicular to the lower surface of the stage 3 and the direction of longitudinal vibration of the piezoelectric element 50 is in parallel to the lower surface of the stage 3.

In this state, the bias rubber 72 is compressed and deformed and the driver elements 59 are biased against the reinforcing members 33 by elastic force of the bias rubber 72. Bias force of each ultrasonic actuator 4A (4B) to the stage 3 is determined by the elastic force of the bias rubber 72.

Note that in this embodiment, the driver elements 59 are in contact with respective lower surfaces of the reinforcing members 33, respectively, at the lower surface of the stage 3. With the reinforcing members 33 provided, the abrasion resistance of the lower surface of the stage 3 is improved.

Figure 9:
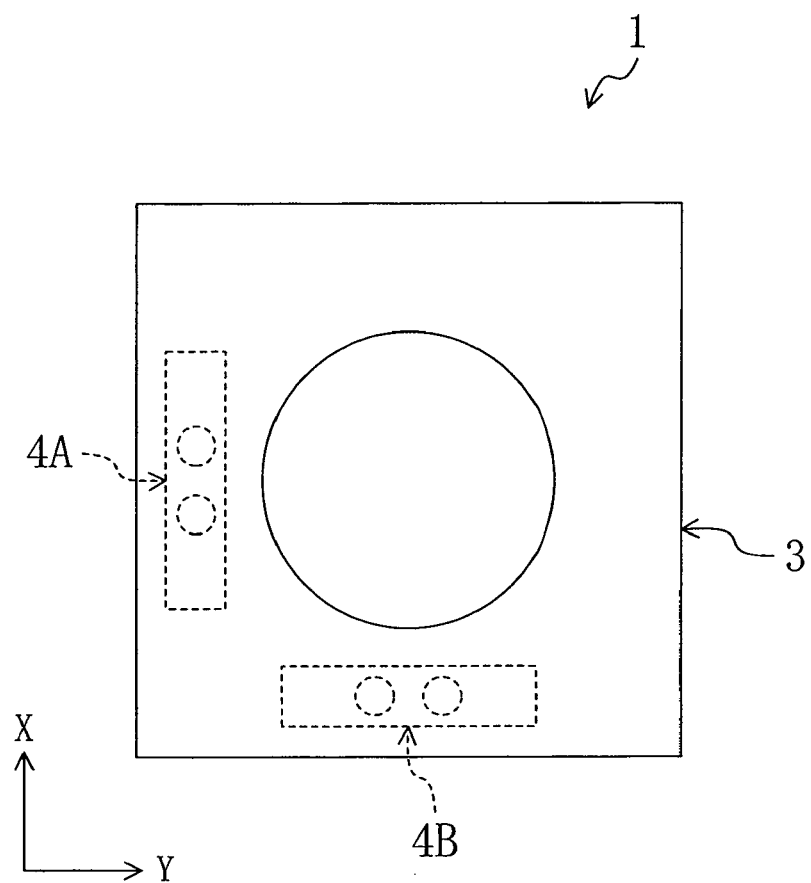
FIG. 9 is a schematic plan view illustrating an arrangement of an ultrasonic actuator.

More specifically, as shown in FIG. 9, the first ultrasonic actuator 4A is arranged in vicinity of one side edge portion of the lower surface of the stage 3 so that the longitudinal direction of the piezoelectric element 50 (i.e., a vibration direction of longitudinal vibration) is in parallel to the side edge portion (this direction is referred to as an X direction). On the other hand, the second ultrasonic actuator 4B is arranged in vicinity of another side edge portion of the lower surface of the stage 3 which is perpendicular to the above-described one side edge portion so that the longitudinal direction of the piezoelectric element 50 is in parallel to the side edge portion (this direction is referred to as a Y direction). In this manner, the first and second ultrasonic actuators 4A and 4B are arranged so that the longitudinal directions of the respective piezoelectric elements 50 are perpendicular to each other when viewed from the top. The first ultrasonic actuator 4A constitutes a first actuator and the second ultrasonic actuator 4B constitutes a second actuator. Furthermore, the X direction corresponds to a first driving direction and the Y direction corresponds to a second driving direction.

Hereinafter, a method for assembling the drive unit 1 will be described.

First, the first and second ceiling wall sections 23 and 24 of the fixed member 2 are attached to the respective end portions of the side wall sections 22.

Next, the rolling elements 26 are provided in the receiving holes 31 of the stage 3 and then the stage 3 is attached to the first and second ceiling wall sections 23 and 24 of the fixed member 2 by the support springs 25.

Subsequently, the first and second ultrasonic actuators 4A and 4B are provided between the bottom wall portion 21 of the fixed member 2 and the stage 3. In a state where the stage 3 is attached to the fixed member 2, a distance from the upper surface of the bottom wall portion 21 of the fixed member 2 to the lower surface of the stage 3 is shorter than a length of each of the first and second ultrasonic actuators 4A and 4B in the lateral direction. Then, in a state where the actuator body 5 is pressed toward the long side wall portion 64 of the case 6 and the bias rubber 72 is compressed and deformed, each ultrasonic actuator 4A (4B) is provided between the bottom wall portion 21 of the fixed member 2 and the stage 3. After each ultrasonic actuator 4A (4B) is placed in a desired location, the case 6 is fixed against the bottom wall portion 21 of the fixed member 2 and signal lines (not shown) are connected to the terminal electrodes provided on the outer surface of the case 6 from a control system (not shown). In this state, the driver elements 59 of each ultrasonic actuator 4A (4B) are in contact with the reinforcing members 33 of the stage 3.

-Operation of Drive Unit-

Next, the operation of the drive unit 1 having the above-described structure will be described.

As described above, in each of the first and the second ultrasonic actuators 4A and 4B, the external electrode 55 is connected to the ground via the terminal electrodes of the case 6 and an alternating voltage at a predetermined frequency and an alternating voltage having a phase shifted from the phase of the alternating voltage by 90° are applied to the external electrode 56 and the external electrode 57, respectively. Accordingly, the piezoelectric element 50 generates composite vibration of longitudinal vibration and bending vibration, thereby having the driver elements 59 make an approximately elliptical motion in a plane parallel to the principal surfaces of the piezoelectric element 50. Thus, while the driver elements 59 periodically repeat contact and separation with and from the stage 3, the stage 3 is moved by frictional force along a long side of the piezoelectric element 50. That is, the first and second ultrasonic actuators 4A and 4B apply driving force to the stage 3 along the long side of the piezoelectric element 50. As shown in FIG. 8, the two driver elements 59 of each of the actuators make an approximately elliptical motion with their respective phases shifted from each other by 180° and accordingly the stage 3 is driven alternately by the driver elements 59.

In Embodiment 1, the first ultrasonic actuator 4A moves the stage 3 in the X direction and the second ultrasonic actuator 4B moves the stage 3 in the Y direction.

Then, a movement in the X direction and a movement in the Y direction are combined by adjusting respective moving distances of the stage 3 by the first ultrasonic actuator 4A and the second ultrasonic actuator 4B, so that the stage 3 can be moved in an arbitrary direction in a plane parallel to the lower surface of the stage 3 (which is, specifically, the lower surface of the reinforcing members 33). More specifically, the moving distance by each ultrasonic actuator 4A (4B) can be adjusted by adjusting at least one of a voltage value, a frequency and a supply time of an alternating voltage to be supplied to each of the external electrodes 56 and 57, or by changing an amount of the shift between phases of alternating voltages to be supplied to the external electrode 56 and the external electrode 57, respectively, to some other value than 90°. In moving the stage 3 by combining the movement in the X direction and the movement in the Y direction in the above-described manner, the first ultrasonic actuator 4A and the second ultrasonic actuator 4B may be simultaneously driven to move the stage 3 toward a desired location. Also, the first ultrasonic actuator 4A and the second ultrasonic actuator 4B may be alternately driven to move the stage 3 separately in the X direction and in the Y direction so that the stage 3 finally reaches a desired location.

Next, the case where the stage 3 is moved in only one of the X direction and the Y direction will be described. For example, in moving the stage 3 only in the X direction, the first ultrasonic actuator 4A causes the piezoelectric element 50 to generate composite vibration of longitudinal vibration and bending vibration to apply driving force to the stage 3, while the second ultrasonic actuator 4B causes the piezoelectric element 50 to generate vibration substantially only in a plane parallel to the lower surface of the stage 3 (specifically, the lower surface of the reinforcing members 33), i.e., generate only longitudinal vibration, thereby sliding the driver elements 59 with respect to the stage 3.

Specifically, the same alternating voltages are applied to the external electrode 56 and the external electrode 57 of the ultrasonic actuator 4B. That is, alternating voltages having the same phase are applied to the first electrodes 52a and 52b and the second electrodes 53a and 53b (see FIG. 5) of the piezoelectric element 50. Thus, four areas in the piezoelectric element 50 corresponding to the electrodes simultaneously expand and contract and thus, substantially only longitudinal vibration shown in FIG. 5 is induced in the piezoelectric element 50. In this state, in longitudinal vibration of FIG. 5, the piezoelectric element 50 slightly vibrates in the lateral direction thereof as well, but this vibration in the lateral direction is so small as to be ignorable, compared to longitudinal vibration in the longitudinal direction. That is, "substantially" means here that some other type of vibration exists but the size of the vibration is so small as to be ignorable.

As a result, friction force between the second ultrasonic actuator 4B and the stage 3 can be reduced, so that the stage 3 can be efficiently moved in the X direction by the first ultrasonic actuator 4A.

Hereinafter, this point will be explained in detail. Assume that in moving the stage 3 only in the X direction, the second ultrasonic actuator 4B is kept in a halt state and only the first ultrasonic actuator 4A is driven. In this case, even though the actuator body 5 of the second ultrasonic actuator 4B is in a halt state, the actuator body 5 is biased against the stage 3 and thus friction force between each of the driver elements 59 of the second ultrasonic actuator 4B and the stage 3 restricts driving of the stage 3 in the X direction by the first ultrasonic actuator 4A. Particularly, friction force between each of the driver elements 59 and the stage 3 is static friction until the stage 3 starts moving and, therefore, large driving force is needed at a time when the stage 3 starts moving. As shown in this embodiment, in the structure in which the stage 3 is driven by two ultrasonic actuators, the driving direction by the one ultrasonic actuator 4A (4B) is a direction which causes a moment of which a center is the driver elements 59 of the other ultrasonic actuator 4B (4A). Accordingly, if friction force between each of the driver elements 59 of the other ultrasonic actuator 4B (4A) is large, the stage 3 might rotate with the driver elements 59 of the second ultrasonic actuator 4B being centered.

In contrast, in Embodiment 1, when the first ultrasonic actuator 4A is driven, the second ultrasonic actuator 4B causes the piezoelectric element 50 to generate substantially only longitudinal vibration at the same time of driving the first ultrasonic actuator 4A or even before driving the first ultrasonic actuator 4A. As a result, the driver elements 59 slide with respect to the lower surface of the stage 3 and a friction state between each of the driver elements 59 and the lower surface of the stage 3 is changed from static friction to dynamic friction, thus reducing friction force.

Moreover, the driver elements 59 vibrate in parallel to the lower surface of the stage 3. Therefore, the sliding speed of the driver elements 59 with respect to the lower surface of the stage 3 is increased and thus a dynamic friction coefficient is reduced. As a result, compared to a dynamic friction state in which only the stage 3 is moved with respect to the driver elements 59 being in a halt state, dynamic friction force can be reduced.

Furthermore, since the driver elements 59 vibrate substantially in a plane parallel to the lower surface of the stage 3, bias force of the driver elements 59 against the stage 3 is not increased, i.e., friction force is not increased. Note that the piezoelectric element 50 slightly expands and contracts along the short side (which is perpendicular to the lower surface of the stage 3) as it expands and contracts along the long side (which is parallel to the lower surface of the stage 3). However, the expanding and contracting along the short side is very small, compared to the expanding and contracting along the long side, and thus hardly affects the stage 3.

In the above-described manner, friction force between each of the driver elements 59 and the stage 3 can be reduced. Accordingly, in moving the stage 3 only in the X direction by the first ultrasonic actuator 4A, the stage 3 can be prevented from rotating with the driver elements 59 of the second ultrasonic actuator 4B being centered and also friction loss between the stage 3 and each of the driver elements 59 can be reduced.

The above-described movements of the first and second ultrasonic actuators 4A and 4B can be used not only when the stage 3 is desired to be driven merely in the X direction toward a desired location in the X direction but also when the stage 3 is desired to be moved in the X direction in moving the stage 3 alternately in the X direction and in the Y direction in order to move the stage 3 to a desired location in an arbitrary direction between the X direction and the Y direction.

In the above description, only the case where the stage 3 is moved in the X direction has been explained. In moving the stage 3 only in the Y direction, the roles of the first ultrasonic actuator 4A and the second ultrasonic actuator 4B are reversed.

Therefore, according to the Embodiment 1, in moving the stage 3 using only one of the first and second ultrasonic actuators 4A and 4B in a moving direction corresponding to the ultrasonic actuator, the other ultrasonic actuator is made to vibrate in parallel to the lower surface of the stage 3. Thus, a friction state between each of the driver elements 59 of the other ultrasonic actuator and the stage 3 is changed to a dynamic friction state and also the sliding speed of the driver elements 59 on the stage 3 is increased to reduce a dynamic friction coefficient. Accordingly, friction force between each of the driver elements 59 and the stage 3 can be reduced and the stage 3 can be smoothly and efficiently moved by the one ultrasonic actuator.

Moreover, by forming each of the first and second ultrasonic actuators 4A and 4B into a structure where vibration of the piezoelectric element 50 in parallel to the lower surface of the stage 3 is a longitudinal direction and also providing the driver elements 59 so that the driver elements 59 are symmetrically located about a center portion of a long side surface of the piezoelectric element 50 in the longitudinal direction, as described above, the driver elements 59 can be prevented from giving unnecessary driving power to the stage 3 when only vibration in parallel to the lower surface of the stage 3 is generated in the piezoelectric element 50 to slide the driver elements 59 with respect to the stage 3.

More specifically, even with the piezoelectric element 50 in a halt state, the driver elements 59 are biased against the stage 3 by the bias rubber 72 and thus small friction force is generated between each of the driver elements 59 and the stage 3 even when the piezoelectric element 50 is vibrated only in parallel to the lower surface of the stage 3. By the way, as described above, if the piezoelectric element 50 on which the driver elements 59 are provided so as to be symmetrically located about the center portion of the long side surface in the longitudinal direction is brought into longitudinal vibration, the driver elements 59 vibrate along the long side with the center portion in the longitudinal direction as the center so that their respective vibration directions are opposite to each other but their amplitudes are the same. That is, friction force generated when the driver elements 59 slide with respect to the stage 3 is symmetrical about the center portion of the piezoelectric element 50 in the longitudinal direction and, therefore, respective frictions of the driver elements 59 cancel each other. As a result, when the piezoelectric element 50 is vibrated in parallel to the lower surface of the stage 3, driving force can be kept from being applied from the driver elements 59 to the stage 3, and accordingly inhibition of movement of the stage 3 by one of the ultrasonic actuators 4A and 4B can be prevented.

Furthermore, when each of the first and second ultrasonic actuators 4A and 4B is formed so that the vibration of the piezoelectric element 50 in parallel to the lower surface of the stage 3 is longitudinal vibration, the piezoelectric element 50 is arranged between the bottom wall portion 21 of the fixed member 2 and the stage 3 so that the lateral direction of the piezoelectric element 50 is perpendicular to the lower surface of the stage 3 and the longitudinal direction of the piezoelectric element 50 is in parallel to the surface of the stage 3. Therefore, compared to the structure in which the piezoelectric element 50 is arranged so that the longitudinal direction of the piezoelectric element 50 is perpendicular to the lower surface of the stage 3, a distance between the bottom wall portion 21 and the stage 3 can be reduced, thus resulting in downsizing of the drive unit 1.

Embodiment 2

Next, Embodiment 2 of the present invention will be described. Embodiment 2 is different from Embodiment 1 in the point that a drive unit 201 of Embodiment 2 includes an ultrasonic actuator having a different structure from the structure of the ultrasonic actuator of Embodiment 1. Hereinafter, each member having the same structure as the structure described in Embodiment 1 is identified by the same reference numeral and therefore the description thereof will be omitted.

Figure 10:
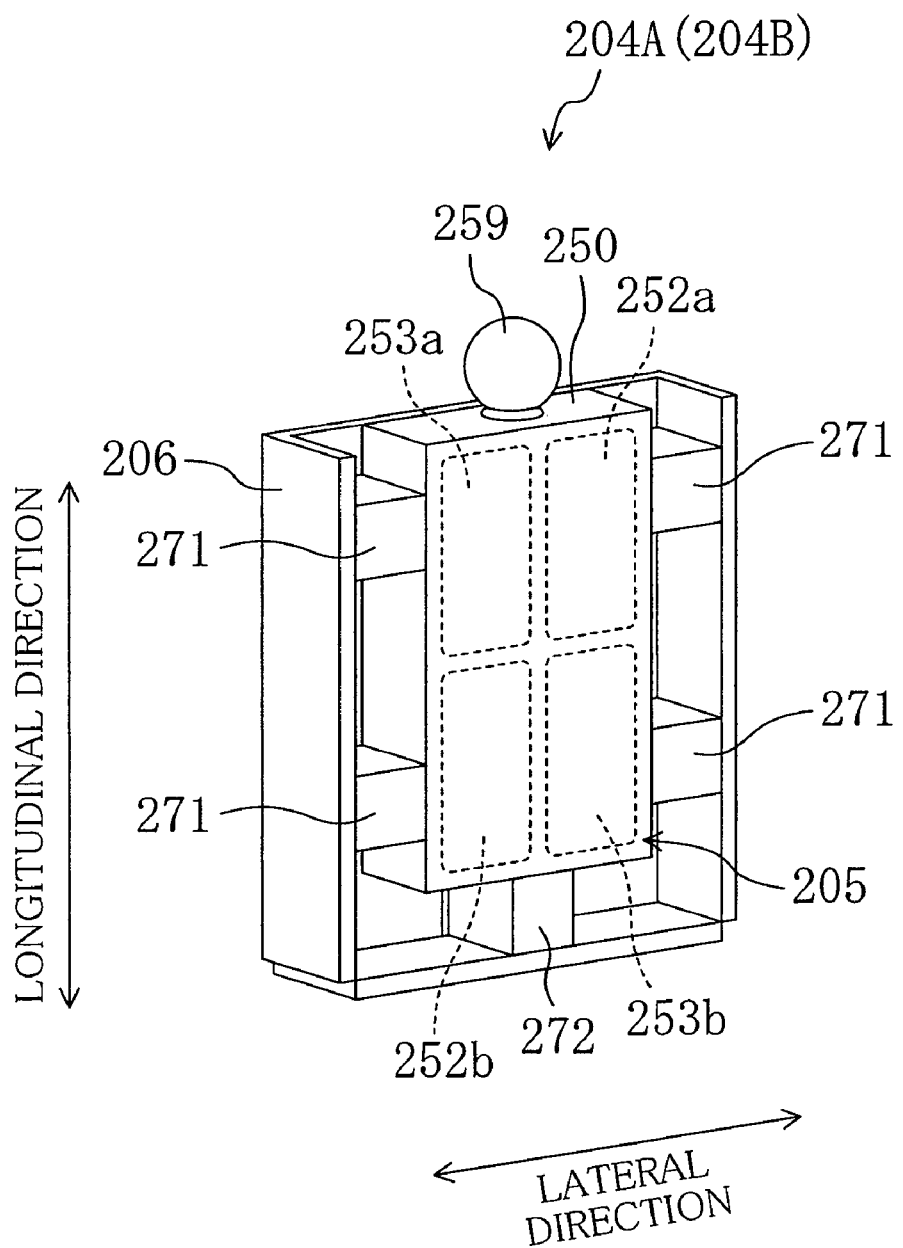
FIG. 10 is a perspective view of an ultrasonic actuator according to Embodiment 2.

As shown in FIG. 10, an actuator body 205 according to Embodiment 2 is provided with a single driver element 259 on one of short side surfaces of a piezoelectric element 250. The actuator body 205 is placed in a case 206 so that a bias rubber 272 is in contact with the other one of the short side surfaces of the piezoelectric element 250. In this state, the driver element 259 sticks out from the case 206. Each of long side surfaces of the piezoelectric element 250 has two support rubbers 271 so that the two support rubbers 271 are located between an associated one of the long side surfaces and the case 206.

Suppose that a principal surface of the piezoelectric element 250 is divided in four areas, i.e., two areas in the longitudinal direction and two areas in the lateral direction. In the piezoelectric element 250, first electrodes 252a and 252b and second electrodes 253a and 253b are provided in the same manner as in the piezoelectric element 50 of Embodiment 1. The first electrodes 252a and 252b and the second electrodes 253a and 253b may be formed so that power is separately supplied to each of the electrodes, or so that power is supplied for each pair of electrodes located in a diagonal direction of the principal surface at a time in the same manner as in Embodiment 1.

As shown in FIG. 8, longitudinal vibration and bending vibration are induced in cooperated manner in the piezoelectric element 250 by applying alternating voltages having phases shifted from each other by 90° to two pairs of electrodes each being located in an associated one of diagonal directions of the piezoelectric element 250, i.e., a pair of the first electrodes 252a and 252b and a pair of the second electrodes 253a and 253b, respectively. As a result, the driver element 259 makes an elliptical motion in a plane parallel to the principal surface of the piezoelectric element 250.

Each of first and second ultrasonic actuators 204A and 204B each having the above-described structure is arranged between a bottom wall portion 21 of a fixed member 2 and a lower surface of a stage 3 so that the driver element 259 is in contact with the lower surface of the stage 3 (specifically, a reinforcing member 33) and a longitudinal direction of the piezoelectric element 250 is in a normal direction of the lower surface of the stage 3. In other words, each of the first and second ultrasonic actuators 204A and 204B is arranged so that a direction of longitudinal vibration of the piezoelectric element 250 is perpendicular to the lower surface of the stage 3 and a direction of bending direction of the piezoelectric element 250 is in parallel to the lower surface of the stage 3.

In this structure, the first ultrasonic actuator 204A is arranged so that a lateral direction of the piezoelectric element 250 is in the X direction and the second ultrasonic actuator 204B is arranged so that a lateral direction of the piezoelectric element 250 is in the Y direction.

As has been described above, in this state, composite vibration of longitudinal vibration and bending vibration is generated in the actuator body 205 of each ultrasonic actuator 204A (204B), thereby driving the stage 3.

As in Embodiment 1, respective moving distances of the stage 3 by the first ultrasonic actuator 204A and the second ultrasonic actuator 204B are adjusted to combine respective movements of the stage 3 in the X direction and in the Y direction, so that the stage 3 can be moved in an arbitrary direction in a plane parallel to the lower surface of the stage 3.

In moving the stage 3 in only one of the X direction and the Y direction, i.e., for example, only in the X direction, the first ultrasonic actuator 204A makes the piezoelectric element 250 generate composite vibration of longitudinal vibration and bending vibration to apply driving force to the stage 3, while the second ultrasonic actuator 204B makes the piezoelectric element 250 generate vibration substantially only in a plane parallel to the lower surface of the stage 3, thereby sliding the driver element 259 with respect to the stage 3. Specifically, the second ultrasonic actuator 204B generates substantially only bending vibration of FIG. 7 in the piezoelectric element 250. By applying an alternating voltage only to one of the pairs of electrodes, i.e., the first electrodes 252a and 252b or the second electrodes 253a and the 253b, or applying alternating voltages having phases shifted from each other by 180° to the first electrodes 252a and 252b and the second electrodes 253a and the 253b, respectively, substantially only bending vibration can be generated in the piezoelectric element 250. In this case, the driver element 259 vibrates in a plane parallel to the lower surface of the stage 3 without increasing bias force against the stage 3. As a result, the driver element 259 slides with respect to the stage 3.

Therefore, according to Embodiment 2, as in Embodiment 1, in moving the stage 3 by only one of the first and second ultrasonic actuators 204A and 204B in a moving direction in accordance with the ultrasonic actuator, the other one of the first and second ultrasonic actuators 204A and 204B is vibrated in parallel to the lower surface of the stage 3, i.e., only bending vibration of the other ultrasonic actuator is induced. Thus, a friction state between the driver element 259 of the other ultrasonic actuator and the stage 3 is made to be a dynamic friction state. Also, the sliding speed of the driver element 259 on the stage 3 is increased and the dynamic friction coefficient is reduced, so that friction force between the driver element 259 and the stage 3 can be reduced.

Accordingly, the stage 3 can be smoothly and efficiently moved by the one ultrasonic actuator.

Embodiment 3

Subsequently, Embodiment 3 of the present invention will be described. Embodiment 3 is different from Embodiment 1 in the point that a drive unit includes an ultrasonic actuator having a different structure from the structure of the ultrasonic actuator of Embodiment 1. Hereinafter, each member having the same structure as the structure described in Embodiment 1 is identified by the same reference numeral and therefore the description thereof will be omitted.

Figure 11:
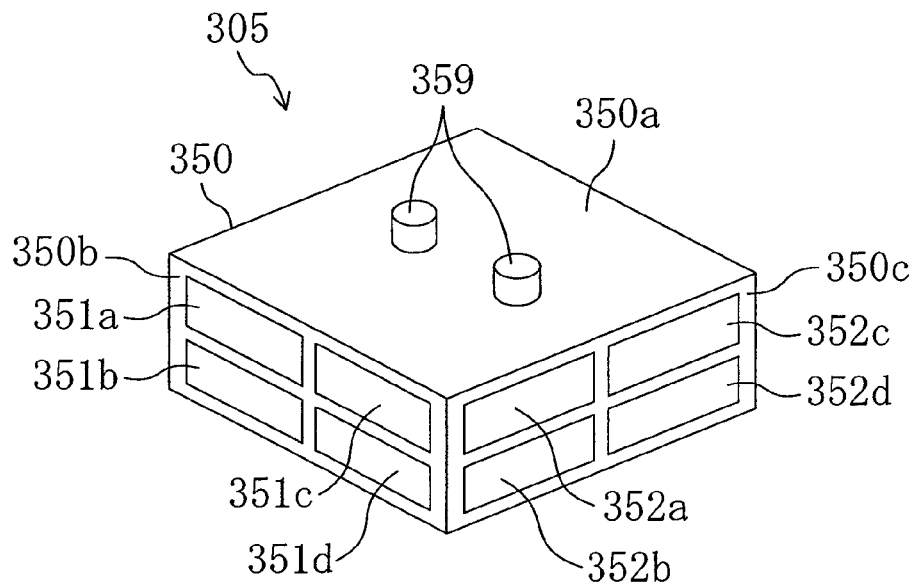
FIG. 11 is a perspective view of an actuator body according to Embodiment 3.
Figure 12:
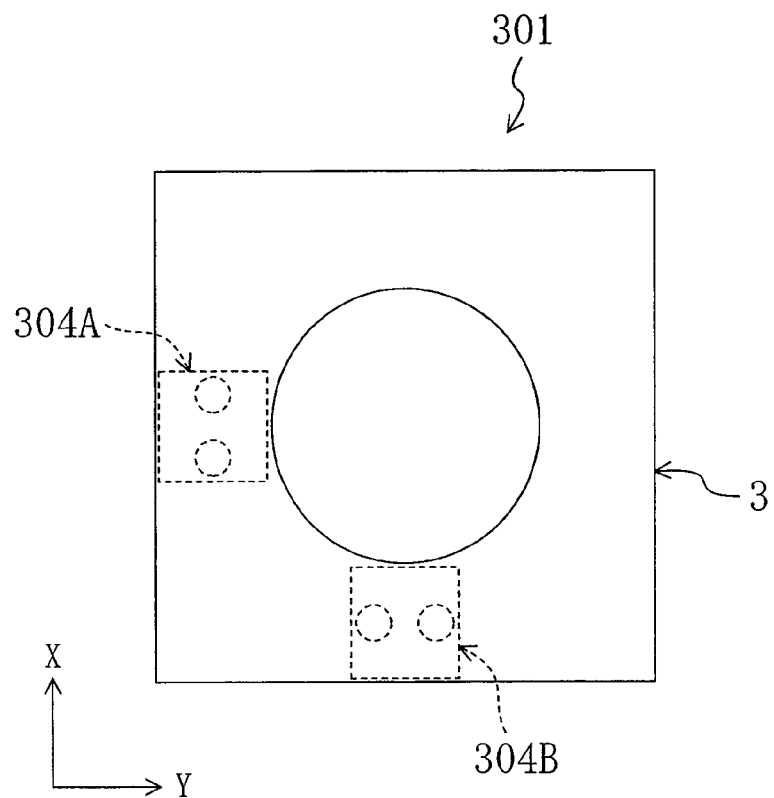
FIG. 12 is a schematic plan view illustrating an arrangement of an ultrasonic actuator.

Each of first and second ultrasonic actuators 304A and 304B according to Embodiment 3 includes an actuator body 305 of FIG. 11, a case (not shown) for housing the actuator body 305, support rubbers (not shown) for elastically supporting the actuator body 305 in the case, and a bias rubber (not shown) for biasing the actuator body 305 against the stage 3.

As shown in FIG. 11, the actuator body 305 includes a metal body part 350, a plurality of piezoelectric elements 351a, 351b . . . , and driving elements 359 provided on the body part 350.

The body part 350 includes an upper surface 350a and a lower surface (not shown) each having an approximately square shape and four side surfaces 350b and 350c (only two are shown in FIG. 15) each having an approximately rectangular shape. Each of the side surfaces is arranged so that both of long side portions thereof are in touch with an associated one of side portions of the upper surface 350a and an associated one of side portions of the lower surface, i.e., a lateral direction of each of the side surfaces is in the vertical direction.

Two driving elements 359 are provided on the upper surface 350a of the body part 350. The two driving elements 359 are arranged so as to align in a line passing through the barycenter of the upper surface 350a and extending in parallel to a pair of side portions of the upper surface 350a.

Four piezoelectric elements 351a, 351b, 351c and 351d and four piezoelectric elements 352a, 352b, 352c and 352d are attached, respectively, onto two side surfaces of 350b and 350c of the body part 350 which are adjacent to each other. The piezoelectric elements 351a, 351b, 351c and 351d are respectively arranged in four areas, i.e., two areas in the longitudinal direction and two areas in the lateral direction of the side surface 350b. In the same manner, piezoelectric elements 352a, 352b, 352c and 352d are respectively arranged in four areas, i.e., two areas in the longitudinal direction and two areas in the lateral direction of the side surface 350c. Unlike Embodiments 1 and 2, the piezoelectric elements 351a, 351b, 351c and 351d and the piezoelectric elements 352a, 352b, 352c and 352d are formed so that a signal electrode is provided in each piezoelectric element. Accordingly, an entire piezoelectric element uniformly expands and contracts by supplying power to the entire piezoelectric elements at a time.

In the actuator body 305 having the above-described structure, on the side surface 350b, alternating voltages having phases shifted from each other by 90° are respectively applied to the pair of piezoelectric elements 351a and 351d diagonally located and the other pair of piezoelectric elements 351b and 351d diagonally located, thereby generating longitudinal vibration along a long side of the side surface 350b and bending vibration along a short side of the side surface 350b in a cooperated manner in the body part 350. As a result, each of the driving elements 359 makes an approximately elliptical motion in a plane parallel to the side surface 350b.

Also, in the actuator body 305, on the side surface 350c, alternating voltages having phases shifted from each other by 90° are applied to the pair of piezoelectric elements 352a and 352d diagonally located and the other pair of piezoelectric elements 352b and 352d diagonally located, respectively, thereby generating longitudinal vibration along a long side of the side surface 350c and bending vibration along a short side of the side surface 350c in a cooperated manner in the body part 350. As a result, each of the driving elements 359 makes an approximately elliptical motion in a plane parallel to the side surface 350c.

As the ultrasonic actuator 4A and 4B of the Embodiment 1 shown in FIGS. 1 and 2, each of the first and second ultrasonic actuators 304A and 304B each of which includes the actuator body 305 having the above-described structure is arranged between a bottom wall portion 21 of a fixed member 2 and a lower surface of a stage 3 (specifically, a reinforcing member 33). Specifically, the first ultrasonic actuator 304A is arranged in vicinity of one side edge portion of the lower surface of the stage 3 so that the direction in which the driving elements 359 align is in parallel to the side edge portion (this direction is referred to as an X direction), i.e., the longitudinal direction of the side surface 350b of the piezoelectric element 350 is in parallel to the side edge portion. On the other hand, the second ultrasonic actuator 304B is arranged in vicinity of another side edge portion of the lower surface of the stage 3 which is perpendicular to the one side edge portion so that the direction in which the driving elements 359 align is in parallel to the side edge portion (this direction is referred to as a Y direction), i.e., the longitudinal direction of the side surface 350b of the piezoelectric element 350 is in parallel to the side edge portion.

In the drive unit 301 having the above-described structure, the first ultrasonic actuator 304A has the driving elements 359 make an approximately elliptical motion in a plane parallel to the side surface 350b (of which the longitudinal direction is in the X direction), basically, by driving the piezoelectric elements 351a, 351b, 351c and 351d provided on the side surface 350b. That is, the first ultrasonic actuator 304A is mainly used to move the stage 3 in the X direction. On the other hand, the second ultrasonic actuator 304B has the driving elements 359 to make an approximately elliptical motion in a plane parallel to the side surface 350b (of which the longitudinal direction is in the Y direction), basically, by driving the piezoelectric elements 351a, 351b, 351c and 351d provided on the side surface 350b. That is, the first ultrasonic actuator 304B is mainly used to move the stage 3 in the Y direction.

In moving the case where the stage 3 in only one of the X direction and the Y direction, for example, only in the Y direction, the second ultrasonic actuator 304B has the driving elements 359 make an approximately elliptical motion in a plane parallel to the side surface 350b of which the longitudinal direction is in the Y direction, thereby moving the stage 3 in the Y direction and, on the other hand, the first ultrasonic actuator 304A has the driving elements 359 vibrate in a plane parallel to the side surface 350c by driving the piezoelectric elements 352a, 352b, 352c and 352d provided on the side surface 350c of which the longitudinal direction is in the Y direction. At this time, in the first ultrasonic actuator 304A, alternating voltages having the same phase are applied to the four piezoelectric elements 352a, 352b, 352c and 352d on the side surface 350c to generate only longitudinal vibration along the long side of the side surface 350c in the actuator body 305. Thus, the driving elements 359 of the first ultrasonic actuator 304A perform only longitudinal vibration in the Y direction.

Therefore, according to Embodiment 3, in moving the stage 3 only in one of the X direction and the Y direction, composite vibration of longitudinal vibration and bending vibration is generated in one of the ultrasonic actuators in which the direction of alignment of the driving elements 359 matches a moving direction of the stage 3 and, on the other hand, only longitudinal vibration is generated in the other one of the ultrasonic actuators in which the direction of alignment of the driving elements 359 does not match the moving direction of the stage 3 and, more specifically, in the direction in which the alignment direction is perpendicular to the moving direction. Thus, a friction state between each of the driving elements 359 in one of the ultrasonic actuator in which the direction of alignment of the driving elements 359 does not match the moving direction of the stage 3 and the stage 3 is made to be a dynamic friction state and the sliding speed of the driving elements 359 on the stage 3 is increased, thereby reducing the dynamic friction coefficient. This allows reduction in friction force between each of the driving elements 359 and the stage 3, so that the stage 3 can be smoothly and efficiently moved by one of the ultrasonic actuators in which the direction of alignment of the driving elements 359 matches the moving direction of the stage 3.

In this case, since the longitudinal direction of the driving elements 359 in one of the ultrasonic actuators in which the direction of alignment of the driving elements 359 does not match the moving direction of the stage 3 matches the moving direction of the stage 3, influences on the movement of stage 3 by the driving elements 359 which slide with respect to the stage 3 while making longitudinal vibration can be reduced.

In Embodiment 3, the body part 350 is formed so that the lateral direction of each side surface is in the vertical direction and the body part 350 has a vertically flat rectangular parallelepiped shape. However, the body part 350 is not limited thereto. That is, the body part 350 may be formed to have a vertically long rectangular parallelepiped shape in which the longitudinal direction of each side surface is in the vertical direction. In such case, in moving the stage 3 in only one of the X direction and the Y direction, one of the ultrasonic actuators in which the direction of alignment of the driving elements 359 does not match the moving direction of the stage 3 and more specifically, the alignment direction is perpendicular to the stage 3 makes the body part 350 generate only bending vibration as in Embodiment 2. Thus, the driving elements 359 can be made to slide with respect to the stage 3.

The driving elements 359 are arranged on a straight line passing through the barycenter of the upper surface 350a and extending parallel to a pair of side portions of the upper surface 350a. However, the alignment of the driving elements 359 is not limited thereto.

Other Embodiments

According to the present invention, the following structure may be adopted for the above-described embodiments.

Specifically, in each of the above-described embodiments, the stage 3 is supported by the fixed member 2. However, how to support the stage 3 is not limited thereto. More specifically, an arbitrary supporting structure may be adopted as long as the structure can make the stage 3 move in a predetermined plane.

The stage 3 is provided with the reinforcing members 33. However, a structure in which the reinforcing members 33 are not provided may be used.

The drive unit includes two ultrasonic actuators in total, i.e., the first and second ultrasonic actuators. However, the number of ultrasonic actuators is not limited to two. For example, a structure in which a third ultrasonic actuator is provided so as to be opposed to the first ultrasonic actuator and the stage 3 is moved in the X direction using two ultrasonic actuators may be adopted. Furthermore, a fourth ultrasonic actuator for moving the stage 3 in some other direction than the X direction and the Y direction may be provided.

Also, the above-described ultrasonic actuators are not limited to the above-described structure. For example, each of the ultrasonic actuators do not have to have the structure in which power is supplied to piezoelectric elements via the support rubbers and the bias rubber but may have a structure in which lead lines are connected to piezoelectric elements to supply power to the piezoelectric elements. Moreover, a structure in which a node potion of vibration of each piezoelectric element is supported by an anelastic member may be adopted. Furthermore, the actuator body is formed of a piezoelectric element. However, the actuator body may be formed of a structure in which a piezoelectric element is attached onto a substrate of metal or the like or a structure in which an oscillator is formed of metal or the like and a piezoelectric element is inserted therein. In such structure, an oscillator including a piezoelectric element constitutes an actuator body. That is, an arbitrary structure can be adopted as long as the structure is formed so as to include a piezoelectric element and is capable of generating vibration in two different vibration directions.

Note that the above-described embodiments are essentially preferable examples which are illustrative and do not limit the present invention, its applications and the scope of use of the invention.

As has been described, the present invention is useful for use in a drive unit including two actuators.

What is claimed is:

1. A drive unit comprising:
  a drive target;
  a first actuator which is arranged in contact with the drive target, and drives the drive target in a first drive direction parallel to a contact surface of the drive target by generating a vibration in a direction parallel to the contact surface of the drive target and a vibration in a direction intersecting with the contact surface of the drive target; and
  a second actuator which is arranged in contact with the drive target, and drives the drive target in a second drive direction which is different from the first drive direction and parallel to the contact surface of the drive target by generating a vibration in a direction parallel to the contact surface of the drive target and a vibration in a direction intersecting with the contact surface of the drive target, wherein
  in driving the drive target in only one of the first and second drive directions, one of the first and second actuators corresponding to the one of the drive directions generates a composite vibration of a vibration in a direction parallel to the contact surface of the drive target and a vibration in a direction intersecting with the contact surface of the drive target, while the other actuator of the first and second actuators generates only a vibration in a direction parallel to the contact surface of the drive target.

2. The drive unit of claim 1, wherein
  the first and second actuators generates a longitudinal vibration as the vibration in the direction parallel to the contact surface of the drive target, and generates a bending vibration as the vibration in the direction intersecting with the contact surface of the drive target.

3. The drive unit of claim 2, wherein
  each of the first and second actuators includes: an actuator body which is shaped to have a longitudinal direction and a lateral direction and performs the longitudinal vibration in the longitudinal direction and the bending vibration in the lateral direction; and a plurality of driver elements provided on the actuator body to transmit the vibration of the actuator body to the drive target, and
  the driver elements are provided so as to be symmetrically located about a center portion of the actuator body in the longitudinal direction.

4. The drive unit of claim 1, wherein
  the first and second actuators generates a bending vibration as the vibration in the direction parallel to the contact surface of the drive target, and generates a longitudinal vibration as the vibration in the direction intersecting with the contact surface of the drive target.

5. The drive unit of claim 1, wherein
  the first actuator further generates a vibration in the second drive direction,
  the second actuator further generates a vibration in the first drive direction, and
  in driving the drive target in only one of the first and second drive directions, one of the first and second actuators corresponding to the one of the drive directions generates a composite vibration of a vibration in a direction parallel to the contact surface of the drive target and a vibration in a direction intersecting with the contact surface of the drive target, while the other actuator of the first and second actuators generates only a vibration in the one of the drive directions.

6. The drive unit of any one of claims 1, wherein the first and second drive directions are orthogonal to each other.

7. A drive unit comprising:
  a drive target;
  a first actuator which is arranged in contact with the drive target, and drives the drive target in a predetermined first drive direction parallel to a contact surface of the drive target by generating a vibration in a direction parallel to the contact surface of the drive target and a vibration in a direction intersecting with the contact surface of the drive target; and
  a second actuator which drives the drive target in a second drive direction which is different from the first drive direction and parallel to the contact surface of the drive target, wherein
  in driving the drive target in only the second drive directions, the first actuator generates only a vibration in a direction parallel to the contact surface of the drive target.

* * * * *

UNITED STATES PATENT AND TRADEMARK OFFICE
CERTIFICATE OF CORRECTION

PATENT NO. : 7,667,373 B2
APPLICATION NO. : 12/469153
DATED : February 23, 2010
INVENTOR(S) : Hideaki Mukae and Yusuke Adachi It is certified that error appears in the above-identified patent and that said Letters Patent is hereby corrected as shown below:

Title Page, Item (73), the city should read -- Osaka -- rather than "Kadoma".

Signed and Sealed this

Eleventh Day of May, 2010

David J. Kappos
*Director of the United States Patent and Trademark Office*